(12) United States Patent
Kim

(10) Patent No.: US 10,603,843 B2
(45) Date of Patent: Mar. 31, 2020

(54) CURVED DISPLAY BONDING APPARATUS

(71) Applicant: LG ELECTRONICS INC., Seoul (KR)

(72) Inventor: Daehong Kim, Seoul (KR)

(73) Assignee: LG ELECTRONICS INC., Seoul (KR)

(*) Notice: Subject to any disclaimer, the term of this patent is extended or adjusted under 35 U.S.C. 154(b) by 184 days.

(21) Appl. No.: 15/837,138

(22) Filed: Dec. 11, 2017

(65) Prior Publication Data

US 2019/0099958 A1    Apr. 4, 2019

(30) Foreign Application Priority Data

Sep. 29, 2017    (KR) .................. 10-2017-0127389

(51) Int. Cl.
| | |
|---|---|
| *B29C 65/48* | (2006.01) |
| *B29C 65/00* | (2006.01) |
| *G02F 1/1333* | (2006.01) |
| *B29L 31/34* | (2006.01) |

(52) U.S. Cl.
CPC .............. *B29C 65/48* (2013.01); *B29C 66/01* (2013.01); *G02F 1/133305* (2013.01); *B29L 2031/3475* (2013.01)

(58) Field of Classification Search
CPC . B29C 65/48; B29C 66/01; B29L 2031/3475; G06F 1/16; G02F 1/133305
See application file for complete search history.

(56) References Cited

U.S. PATENT DOCUMENTS

| | | | |
|---|---|---|---|
| 2004/0148907 A1 | 8/2004 | Serafini | |
| 2014/0002973 A1* | 1/2014 | Lee ..................... | H05K 7/00 361/679.01 |
| 2017/0192297 A1 | 7/2017 | Kwon et al. | |
| 2017/0210062 A1 | 7/2017 | Chen et al. | |

FOREIGN PATENT DOCUMENTS

| | | |
|---|---|---|
| JP | 2003-098533 A | 4/2003 |
| JP | 2016-012001 A | 1/2016 |
| KR | 10-1676474 | 11/2016 |

OTHER PUBLICATIONS

International Search Report dated Jun. 21, 2018 issued in Application No. PCT/KR2017/012103.

* cited by examiner

*Primary Examiner* — Vishal I Patel
(74) *Attorney, Agent, or Firm* — Ked & Associates, LLP

(57) ABSTRACT

A curved display bonding apparatus includes an upper adsorption mechanism to which a display is adsorbed, a flexible stage having a deformable outer appearance, and a wire stage on which a curved glass is seated, wherein the wire stage includes a plurality of wires, at least some of which are located above the flexible stage, such that the curved glass is seated on outer surfaces of the wires, at least a pair of the plurality of wires are spaced apart from each other, and the plurality of wires are seated on the flexible stage or are spaced apart from the flexible stage.

20 Claims, 16 Drawing Sheets

FIG. 9
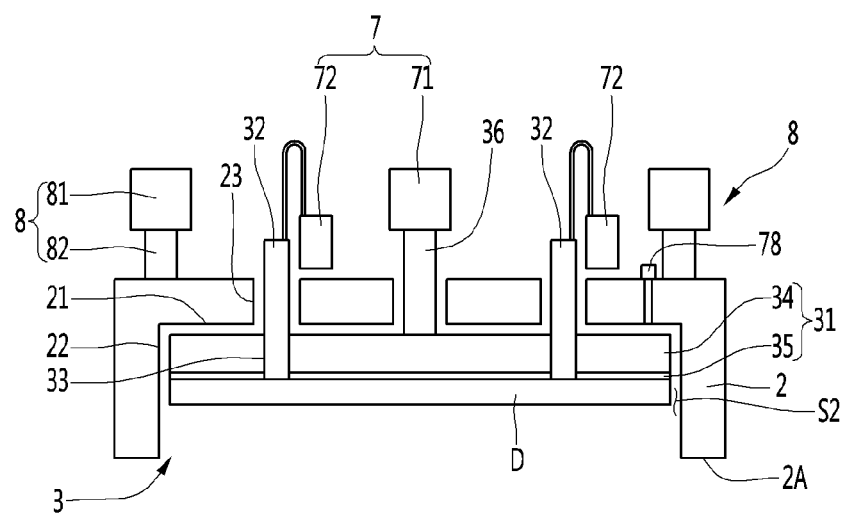
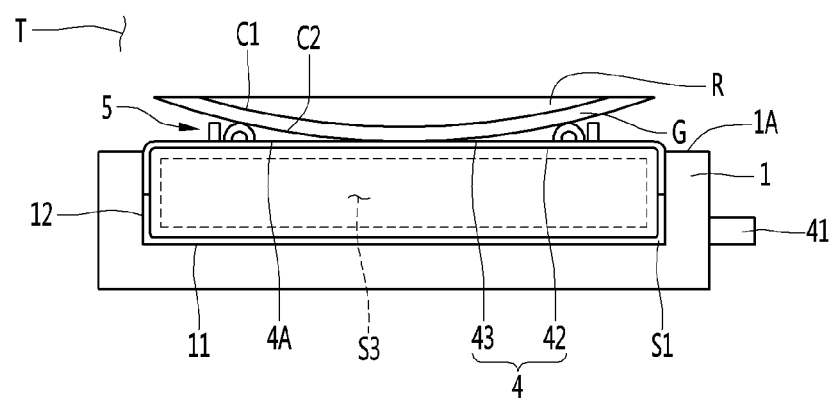

CURVED DISPLAY BONDING APPARATUS

CROSS-REFERENCE TO RELATED APPLICATION(S)

This application claims priority under 35 U.S.C. § 119 to Korean Application No. 10-2017-0127389 filed on Sep. 29, 2017, whose entire disclosure(s) is/are hereby incorporated by reference.

BACKGROUND

1. Field

The present disclosure relates to a curved display bonding apparatus.

2. Background

A curved display, which is not a flat screen but a display that is curved at a constant curvature, is used for electronic products such as mobile devices, monitors and TVs, vehicles, exterior walls of a building, or an interior decoration such as an indoor light. The curved display may include a curved glass and a display unit or display, the display unit may include one surface facing the curved glass, and the surface of the display which faces the curved glass may be a flat surface or a curved surface which is like the curved glass.

The curved glass and the display unit may be bonded to each other by a bonding apparatus, and an example of such a bonding apparatus is disclosed in Korean Patent No. 10-1676474 B1 (Nov. 14, 2016), which is hereby incorporated by reference in its entirety. An apparatus which may bond a display panel made of a flexible material to a curved substrate is disclosed in Korean Patent No. 10-1676474 (Nov. 14, 2016). Such an apparatus may bond the curved substrate and the display panel to each other using fluid pressurization, and includes a fluid pressurizing elastic body part and a flexible material gripping part.

The fluid pressurizing elastic body part may be elastically deformed by fluid pressurization to pressurize a flexible material using the curved substrate. Further, while gripping the fluid pressurizing elastic body part and opposite sides of the flexible material, the flexible material gripping part may control a deformed shape of the fluid pressurizing elastic body part such that the fluid pressurizing elastic body part performs the fluid pressurization while sequentially moving outward from the center of the flexible material.

However, the bonding apparatus disclosed in Korean Patent No. 10-1676474 (Nov. 14, 2016) has a problem in that because the fluid pressurizing elastic body part moves outward from the center of the flexible material, when the display unit is not made of a flexible material, it is not easy to apply the bonding apparatus. The above reference is incorporated by reference herein where appropriate for appropriate teachings of additional or alternative details, features and/or technical background.

BRIEF DESCRIPTION OF THE DRAWINGS

The embodiments will be described in detail with reference to the following drawings in which like reference numerals refer to like elements and wherein:

FIG. 9 is a sectional view of the display unit of FIG. 8 adsorbed in an upper adsorption chuck and the wire stage of FIG. 8 lowered to the flexible stage;

DETAILED DESCRIPTION

Referring to FIGS. 1-5, a curved display bonding apparatus may be an apparatus that bonds a display unit or display D to a curved glass G. Resin R may be formed on any one curved surface of the curved glass G, and the display unit D and the curved glass G may be bonded to each other with the resin R interposed therebetween.

Figure 1:
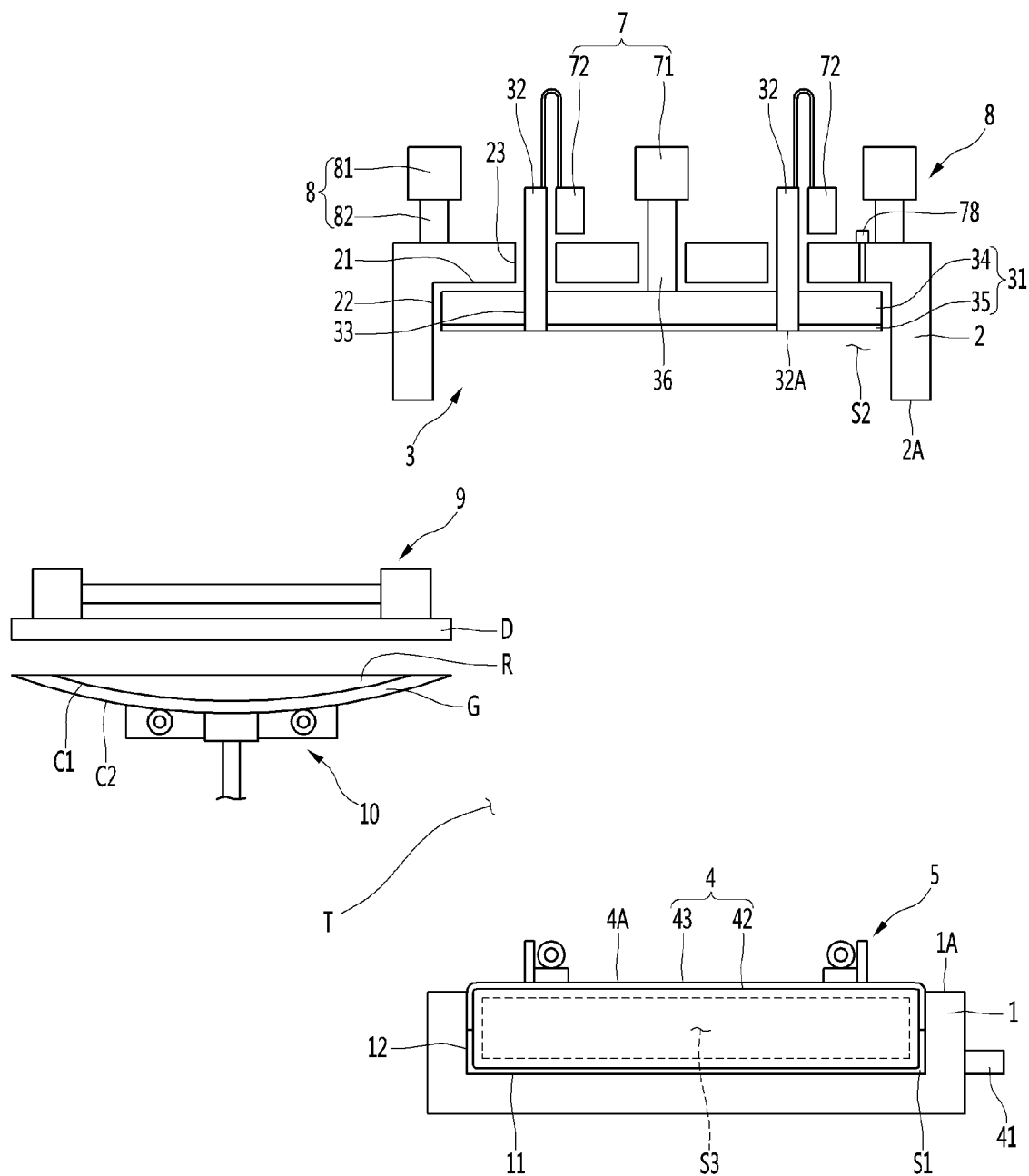
FIG. 1 is a sectional view of a curved display bonding apparatus according to an embodiment of the present disclosure before bonding.

The resin may be an optical adhesive material formed on one surface of the curved glass G as illustrated in FIG. 1 before the display unit D and the curved glass G are bonded to each other. The resin R may be optical adhesive resin in which a transparent adhesive applied to one surface of the curved glass G is cured. The resin R may be formed on one concave surface of opposite surfaces of the curved glass G. The display unit D and the curved glass G may be bonded to each other through the resin R with the resin R interposed therebetween, and the completely-bonded curved display may be a display in which a surface of the curved glass G, which is opposite to the resin R, is curved.

The curved display bonding apparatus may include a lower chamber 1 having a lower space S1 formed therein; an upper chamber 2 arranged above the lower chamber 1 and having an upper space S2 formed therein; an upper adsorption mechanism 3 which is accommodated in the upper space S2 to be elevated and to which the display unit D is adsorbed; a flexible stage 4 accommodated in the lower space S1 and having a deformable outer appearance; and a wire stage or hangar 5 on which the curved glass G is seated. The curved display bonding apparatus may further include an upper chamber driving mechanism 8 configured to elevate the upper chamber 2.

The curved display bonding apparatus may further include an upper adsorption arm 9 configured to transfer the display unit D to a space between the lower space S1 and the upper space S2. The curved display bonding apparatus may further include a lower adsorption arm 10 configured to seat the curved glass G onto the wire stage 5, and more particularly may be a plurality of wires 51.

The lower chamber 1 may support and protect the flexible stage 4. The lower space S1 may be formed in the lower chamber 1 such that an upper surface thereof is opened. At least a portion of the curved glass G and a portion of the wire stage 5 may be moved from the upper side of the lower space S1 to the lower space S1, and may be seated and supported on the flexible stage 4 accommodated in the lower space S1.

The lower chamber 1 may include an inner bottom surface 11 and an inner peripheral surface 12 in contact with an outer surface of the stage 4, and the shape of the flexible stage 4 may be defined by the inner bottom surface 11 and the inner peripheral surface 12 of the lower chamber 1. The lower chamber 1 may define an outer appearance of the bottom surface and an outer appearance of a peripheral surface of the flexible stage 4, when the flexible stage 4 is expanded.

The upper chamber 2 may protect the upper adsorption mechanism 3, and the upper space S2 may be formed in the upper chamber 2 such that a lower surface thereof is opened. At least portions of the display unit D and the curved glass G may be moved to the upper space S2 according to the height of the upper chamber 2. In a state in which the display unit D and the curved glass G are located between the upper adsorption mechanism 3 and the flexible stage 4, when the upper chamber 2 is lowered together with the upper adsorption mechanism 3, at least portions of the display unit D and the curved glass G may be moved to the upper space S2.

The upper chamber 2 may include an inner upper surface 21 and an inner peripheral surface 22 surrounding an outer periphery of the upper adsorption mechanism 3. The upper chamber 2 may be arranged above the lower chamber 1 to be elevated. When the upper chamber 2 is lifted up, a gap T through which the upper adsorption arm 9 and the lower adsorption arm 10 may be moved between the lower space S1 and the upper space S2 may be formed between the upper chamber 2 and the lower chamber 1.

When the upper chamber 2 is lowered, the upper chamber 2 may come into close contact with the lower chamber 1, a sealed space may be formed between the upper chamber 2 and the lower chamber 1, and the display unit D and the curved glass G may be bonded to each other in such a sealed space. When the upper chamber 2 is lowered, a lower end 2A of the upper chamber 2 may come into close contact with an upper end 1A of the lower chamber 1, and a sealing member configured to maintain airtightness between the upper chamber 2 and the lower chamber 1 may be arranged at at least one of the lower end of the upper chamber 2 and the upper end of the lower chamber 1.

When the upper chamber 2 is lowered, the upper space S2 of the upper chamber 2 and the lower space S1 of the lower chamber 1 may define a bonding space in which the curved glass G and the display unit D are bonded to each other. The upper chamber driving mechanism 8 may be connected to the upper chamber 2.

The upper chamber driving mechanism 8 may include a driving source 81 such as a motor, and at least one power transmission member 82 configured to transfer a driving force of the driving source to the upper chamber 2. The power transmission member may be racks and pinions, or the like. The upper chamber driving mechanism 8 may be a hydraulic cylinder, a linear motor, or the like connected to the upper chamber 2.

The upper chamber driving mechanism 8 may be in a rising mode before the display unit D and the curved glass G are moved to a space between the lower chamber 1 and the upper chamber 2. The upper chamber driving mechanism 8 may be in a lowering mode when the display unit D and the curved glass G are bonded to each other. The upper chamber driving mechanism 8 may be in the rising mode again when the display unit D and the curved glass G are completely bonded to each other.

A pressure adjusting mechanism configured to adjust a pressure of the bonding space formed between the lower chamber 1 and the upper chamber 2 may be installed in at least one of the lower chamber 1 and the upper chamber 2. After the upper chamber 2 is completely lowered, and while the curved glass G and the display unit D are bonded to each other, the pressure adjusting mechanism may adjust the bonding space to a vacuum or a predetermined pressure. When the curved glass G and the display unit D are completely bonded to each other, the pressure adjusting mechanism may adjust the bonding space to the atmospheric pressure.

After the curved glass G and the display unit D are completely bonded to each other, when the pressure of the bonding space is adjusted to be equal to the atmospheric pressure, the upper chamber 2 may be lifted up. The upper chamber 2 may have a structure through which a portion of the upper adsorption mechanism 3 passes. A shaft throughhole through which an adsorption chuck shaft 36, which will be described below, passes may be formed in the upper chamber 2.

Further, a pin through-hole 23 through which an upper adsorption pin 32, which will be described below, passes may be formed in the upper chamber 2. The entire upper adsorption mechanism 3 may be located in the upper space S2 or a portion of the upper adsorption mechanism 3 may be located in the upper space S2 and the other portion of the upper adsorption mechanism 3 may be located outside the upper space S2.

The upper adsorption mechanism 3 may include an upper adsorption chuck 31 arranged in the upper space S2 to be elevated. Further, the upper adsorption mechanism 3 may include an upper adsorption pin 32 to which the display unit D may be adsorbed.

The upper adsorption chuck 31 may be smaller than the upper chamber 2, and may be located in the upper space S2 to be elevated. An upper pin elevating hole 33 through which the upper adsorption pin 32 passes to be elevated may be formed in the upper adsorption chuck 31. An upper surface of the display unit D may be attached to a bottom surface of the upper adsorption chuck 31.

The upper adsorption chuck 31 may include an upper adsorption body 34 and an adhesive part 35 formed on a bottom surface of the upper adsorption body 34. The upper adsorption chuck 31 may function as a pressing member configured to press the display unit D to the curved glass G. The upper adsorption body 34 may have a plate shape, and the adsorption chuck shaft 36 may be provided in the upper adsorption body 34.

The adsorption chuck shaft 36 may be formed at an upper portion of the upper adsorption body 34. A lower end of the adsorption chuck shaft 36 may be located in the upper space S2, and an upper end of the adsorption chuck shaft 36 may be arranged to be located above the upper chamber 2. The adhesive part 35 of the upper adsorption mechanism 3, which may actually be in contact with the upper surface of the display unit D, may have an adhesive force to maintain an attachment state of the display unit D.

When the display unit D and the curved glass G are completely bonded to each other, the upper adsorption mechanism 3 may be easily separated from the display unit D. The adhesive part 35 of the upper adsorption mechanism 3 may be resin-based adhesive coating, and the adhesive coating may an adhesive force that is weaker than an adhesive force between the resin R and the display unit D.

An adsorption hole allowing the display unit D to come into close contact with the bottom surface of the upper adsorption chuck 31, particularly, the adhesive part 35, may be further formed in the upper adsorption chuck 31. The upper adsorption mechanism 3 may further include a vacuum generator configured to evacuate an adsorption hole of the upper adsorption chuck 31. When the vacuum generator of the upper adsorption mechanism 3 is switched on, the display unit D may maintain an adsorption state with the upper adsorption chuck 31 by the vacuum of the adsorption hole of the upper adsorption chuck 31.

The upper adsorption mechanism 3 may adsorb the display unit D together with the upper adsorption chuck 31 and the upper adsorption pin 32, and the upper adsorption pin 32 may adsorb the display unit D. The display unit D may be adsorbed to the upper adsorption pin 32, and the upper adsorption pin 32 may move the adsorbed display unit D to the upper adsorption chuck 31. The upper adsorption pin 32 may be lowered to a height at which it comes into contact with the upper surface of the display unit D, and the upper surface of the display unit D may be adsorbed to the upper adsorption pin 32.

The upper adsorption pin 32 may have a contact end 32A in contact with the upper surface of the display unit D, and the upper adsorption pin 32 may have an adsorption hole formed therein to allow the display unit D to come into contact with the contact end 32A. The upper adsorption mechanism 3 may further include a vacuum generator configured to evacuate an adsorption hole of the upper adsorption pin 32. Further, when the vacuum generator is switched on, the display unit D may maintain an adsorption state with the upper adsorption pin 32 by the vacuum of the adsorption hole of the upper adsorption pin 32.

Figure 7:
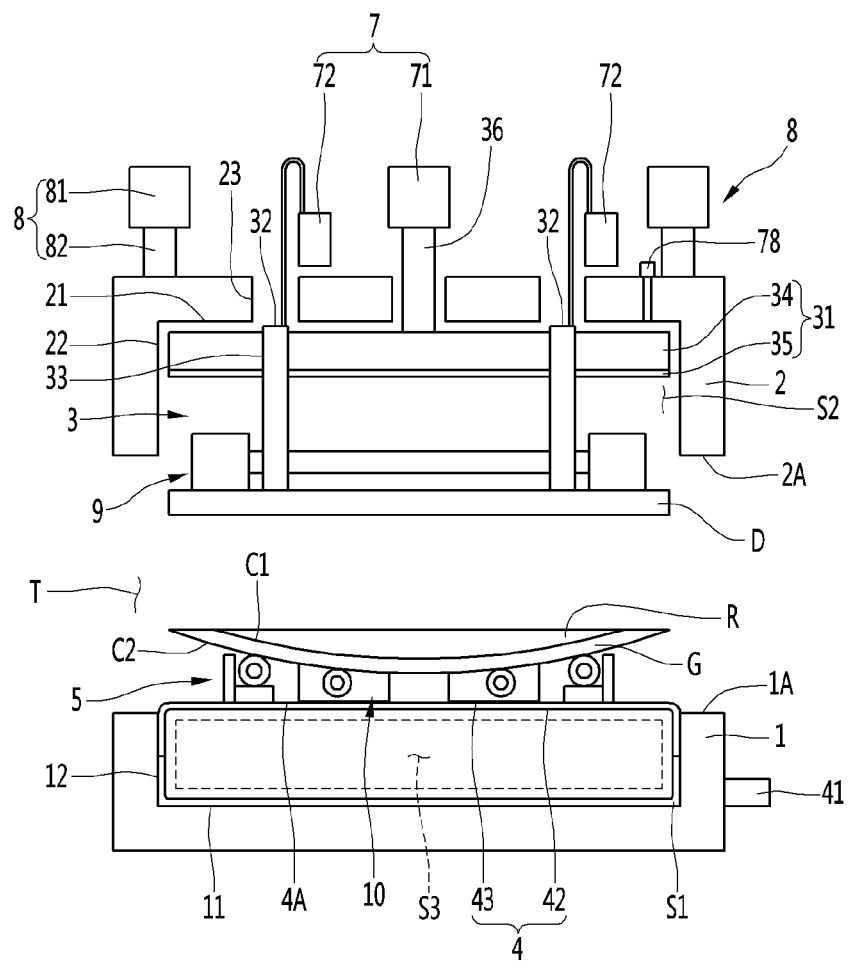
FIG. 7 is a sectional view of the curved glass of FIG. 6 seated on the wire stage and the display unit of FIG. 6 adsorbed in an upper adsorption pin.
Figure 8:
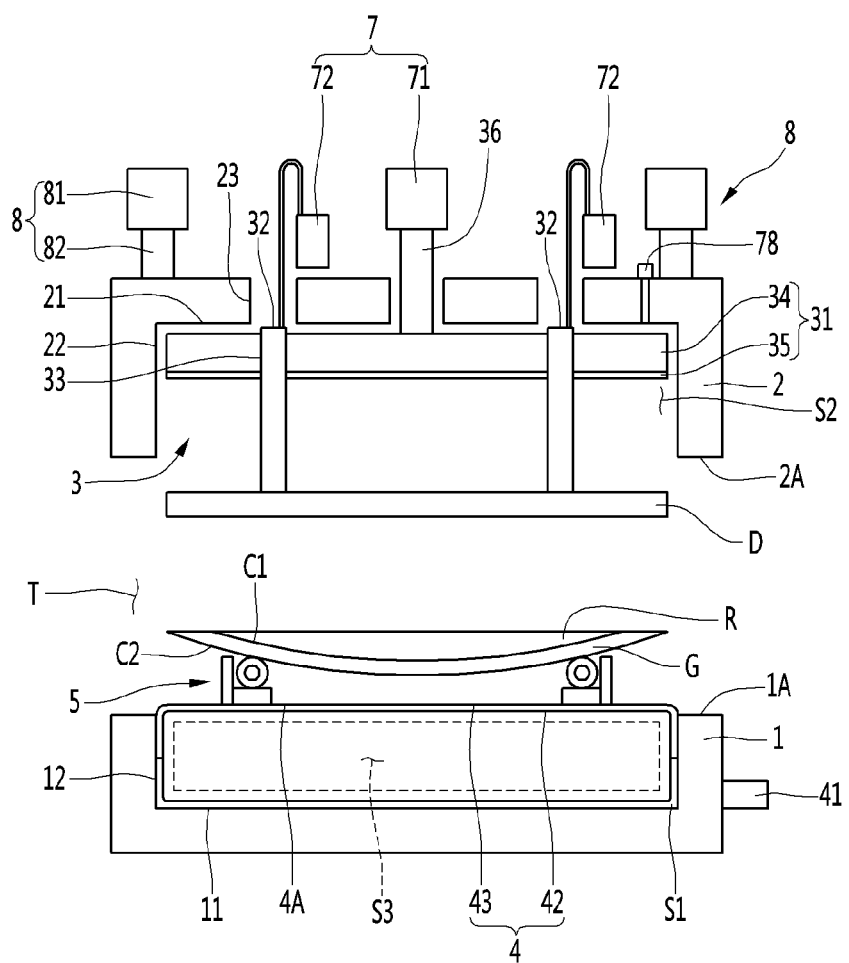
FIG. 8 is a sectional view of an upper adsorption arm and a lower adsorption arm of FIG. 7 completely withdrawn from a space between the lower chamber and the upper chamber to the outside.

The upper adsorption pin 32 may be lowered to adsorb the display unit D and moved to a lower side of the upper space S2, as illustrated in FIG. 7, and may be lifted up to lift the display unit D up to the upper adsorption chuck 31 when the display unit D is adsorbed, as illustrated in FIG. 9. The upper adsorption pin 32 may be lifted up at a height at which the upper surface of the display unit D comes into contact with the bottom surface of the upper adsorption chuck 31, particularly, the adhesive part 35 of the upper adsorption chuck 31.

The curved display bonding apparatus may further include an upper driving mechanism 7 configured to operate the upper adsorption mechanism 3. The upper driving mechanism 7 may move and rotate the upper adsorption mechanism 3 to align the display unit D with the curved glass G. Further, the upper driving mechanism 7 may lower the upper adsorption mechanism 3 to a height at which the upper adsorption mechanism 3 presses the display unit D to the curved glass G.

The upper driving mechanism 7 may independently drive the upper adsorption chuck 31 and the upper adsorption pin 32. The upper driving mechanism 7 may include an upper adsorption chuck driving mechanism 71 configured to drive the upper adsorption chuck 31, and an upper adsorption pin driving mechanism 72 configured to drive the upper adsorption pin 32. The upper adsorption chuck driving mechanism 71 may drive and rotate the adsorption chuck shaft 36 in three axes.

The upper adsorption chuck driving mechanism 71 may be connected to an upper portion of the adsorption chuck shaft 36. The upper adsorption chuck driving mechanism 71 may move the adsorption chuck shaft 36 in X and Y axes corresponding to horizontal directions, may elevate the adsorption chuck shaft 36 in a Z axis corresponding to a vertical direction, and may rotate the adsorption chuck shaft 36.

The upper adsorption chuck driving mechanism 71 may include a plurality of adsorption chuck driving motors for such three-axis movement and rotation. The plurality of adsorption chuck driving motors may include transverse moving motors configured to transversely move the adsorption chuck shaft 36 in the X and Y axes, a vertical moving motor configured to vertically move the adsorption chuck shaft 36 in the Z axis, and a rotation motor configured to rotate the adsorption chuck shaft 36.

The curved display bonding apparatus may include a camera 78 configured to detect exact positions of the display unit D and the curved glass G. Marks may be displayed in the display unit D and the curved glass G, and the camera 78 may detect coincidence or discordance of the marks. The upper adsorption chuck driving mechanism 71 may then move and/or rotate the upper adsorption mechanism 3, particularly, the adsorption chuck shaft 36, such that the marks coincide with each other.

The upper adsorption pin driving mechanism 72 may elevate the upper adsorption pin 32. The upper adsorption pin driving mechanism 72 may include a hydraulic cylinder or a linear motor connected to an upper portion of the upper adsorption pin 32 to elevate the upper adsorption pin 32.

Figure 2:
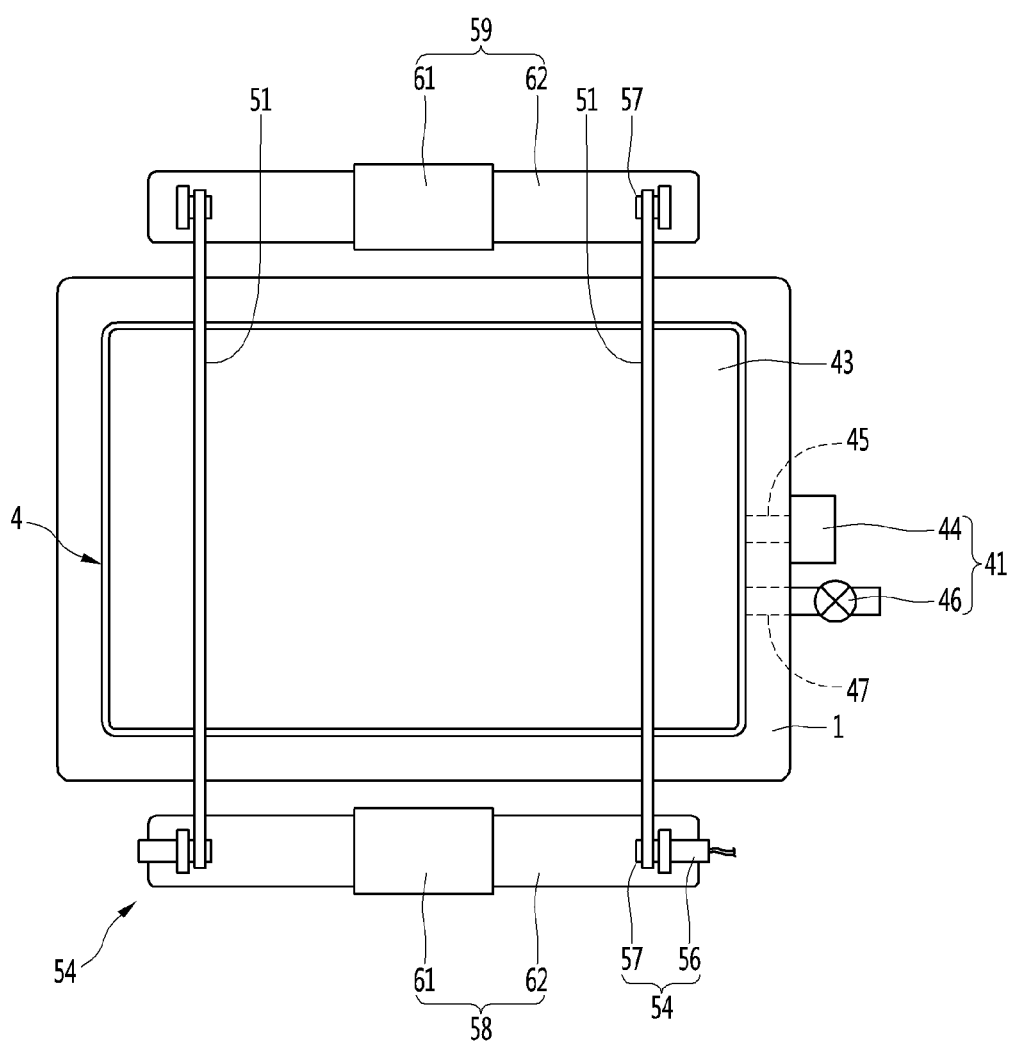
FIG. 2 is a plan view illustrating a wire stage, a lower chamber, and a flexible stage of FIG. 1.

Hereinafter, the flexible stage 4 will be described with reference to FIGS. 1 and 2. When the flexible 4 is accommodated in and supported on the lower chamber 1, an upper surface 4A of the flexible stage 4 may be inflated to the upper side.

An inner space S3 in which fluid is accommodated may be formed inside the flexible stage 4. A fluid adjuster 41 configured to adjust fluid in the inner space S3 may be connected to the flexible stage 4. The flexible stage 4 may have the inner space S3 formed therein, and may include a flexible body 42 expanded or contracted by the fluid in the inner space S3.

The flexible stage 4 may further include an adhesive part 43 formed on an outer surface of the flexible body 42. The adhesive part 43 of the flexible stage 4 may be formed on the entire outer surface of the flexible body 42, or may be formed on an outer surface of an upper portion of the flexible body 42. The adhesive part 43 of the flexible stage 4, which is in surface contact with the curved glass G, may be resin-based adhesive coating, and may help the curved glass G to be stably supported without slipping.

The fluid adjuster 41 may include a fluid injector 44 configured to inject fluid into the inner space S3 of the flexible body 42, and a fluid adjusting valve 46 configured to discharge the fluid of the inner space S3 to the outside. The fluid injector 44 may be connected to the flexible body 42 through a fluid injecting channel 45, and may inject fluid such as gas into the inner space S3 through the fluid injecting channel 45.

One end of the fluid injecting channel 45 may communicate with the inner space S3, and the other end of the fluid injecting channel 45 may be located outside the lower chamber 1. The fluid injector 44 may be a fluid pump such as an air pump or a water pump or a compressor. The fluid injector 44 is not limited to an air pump or a water pump, and various configurations may be applied to the fluid injector 44 as long as the fluid injector 44 may inject fluid such as air or water into the inner space S3.

The fluid injector 44 may be arranged outside the lower chamber 1, and may communicate with the inner space S3 through the fluid injector 45. The fluid adjusting valve 46 may be connected to the flexible body 42 through a fluid discharging channel 47, and may interrupt fluid moving from the inner space S3 to the fluid discharging channel 46. A first end of the fluid discharging channel 47 may communicate with the inner space S3, and a second end of the fluid discharging channel 47 may be located outside the lower chamber 1.

Hereinafter, the wire stage 5 will be described with reference to FIGS. 1 to 3. The wire stage 5 may include the plurality of wires 51. At least a pair of wires 51 may be provided, the at least one pair of wires may be spaced apart from each other, and the curved glass G may be seated on an outer surface of the at least one pair of wires.

The at least one pair of wires 51 may be parallel to each other and may include a plurality of wires 51, and an interval between the plurality of wires may be smaller than a transverse width of the curved glass G. At least a portion of each of the plurality of wires 51 may be located above the flexible stage 4. The plurality of wires 51 may be seated on the flexible stage 4 or may be spaced apart from the flexible stage 4.

Each of the plurality of wires 51 may include inner metal wires and an adhesive coating surrounding the inner metal wire. The plurality of inner metal wires may be provided inside the adhesive coating. The adhesive coating may be a coating having an adhesive layer formed on an outer surface thereof, may protect the inner metal wires, and may minimize sliding of the curved glass G. The adhesive coating may be resin-based adhesive coating.

Figure 3:
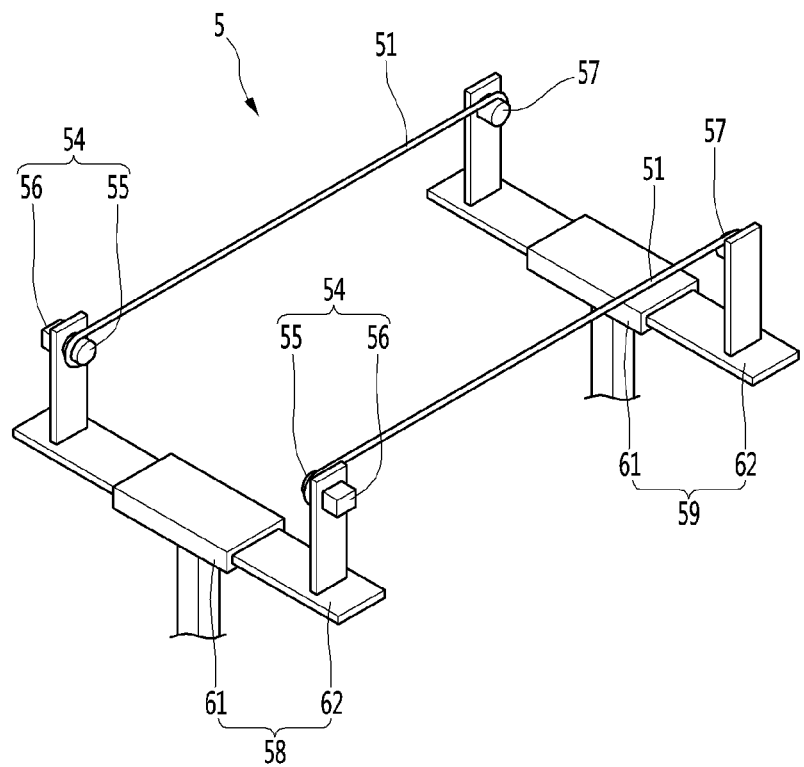
FIG. 3 is a perspective view illustrating the wire stage of FIG. 1.

As illustrated in FIG. 3, the wire stage 5 may include a tension adjuster 54 configured to adjust tension of the wires 51. As illustrated in FIG. 3, the tension adjuster 54 may include a rotor 55 to which the wires 51 are connected, and a motor 56 configured to rotate the rotor 55.

As illustrated in FIG. 3, the wire stage 5 may further include a connector 57 which is spaced apart from the rotor 55 and to which the wires 51 are connected, a tension adjuster frame 58 supporting the tension adjuster 54, and a connector frame 59 supporting the connector 57. In the wire stage 5, the tension adjuster 54, the wires 51, and the connector 57 may constitute one set. Further, the wire stage 5 may include at least a pair of such sets.

The curved display bonding apparatus may further include a wire stage elevating mechanism 6 (see FIG. 5) configured to elevate the tension adjuster frame 58 and the connector frame 59. The wire stage elevating mechanism 6 may be a hydraulic cylinder or a linear motor configured to elevate the tension adjuster frame 58 and the connector frame 59.

The wire stage elevating mechanism 6 may include a tension adjuster elevating mechanism connected to the tension adjuster frame 58 to elevate the tension adjuster frame 58, and a connector elevating mechanism connected to the connector frame 59. In this case, the tension adjuster elevating mechanism and the connector elevating mechanism may be driven together or may be stopped together.

The wire stage elevating mechanism 6 may include an elevating mechanism to which the tension adjuster frame 58 and the connector frame 59 are connected together. Additionally, the lengths of the tension adjuster frame 57 and the connector frame 59 may be adjusted.

As illustrated in FIG. 3, each of the tension adjuster frame 57 and the connector frame 59 may include an elevating body 61 and a moving body 62 arranged in the elevating body 61 to be moved forward/rearward in a transverse direction. The elevating body 61 may be connected to the wire stage elevating mechanism 6, and may be elevated by the wire stage elevating mechanism 6.

The moving body 62 may be connected to the elevating body 61 to be transversely movable. The wire stage elevating mechanism 6 may be configured by an elevation motor, such as a linear motor, connected to the elevating body 61, or may be configured by a power transmission member connected to the elevating body 61 and an elevation motor, such as a motor, connected to the power transmission member.

Hereinafter, the upper adsorption arm 9 will be described below. The upper adsorption arm 9 may transfer the display unit D while one surface of the display unit D vertically faces one surface C1 of the curved glass G.

The upper adsorption arm 9 may be connected to an upper adsorption arm robot 98 (see FIG. 5) configured to move the upper adsorption arm 9. The upper adsorption arm robot 98 may be a first robot that may transversely and vertically move the upper adsorption arm 9.

As illustrated in FIG. 7, the upper adsorption arm 9 may be moved to the lower side of the upper adsorption mechanism 3 to move the display unit D to the lower side of the upper adsorption mechanism 3. When the upper adsorption mechanism 3 adsorbs and lifts up the display unit D, the upper adsorption arm 9 may be moved to the lower side of the upper adsorption mechanism 3 to escape to the outside. The upper adsorption arm 9 may be a robot that may move transversely and vertically.

Hereinafter, the lower adsorption arm will be described below. The lower adsorption arm 10 may seat, on the wires 51, a curved surface C2 that is opposite to a curved surface C1 among opposite surfaces C1 and C2 of the curved glass G.

The lower adsorption arm 10 may be connected to a lower adsorption arm robot 99 (see FIG. 5) configured to move the lower adsorption arm 10. The lower adsorption arm robot 99 may be a second robot that may transversely and vertically move the lower adsorption arm 10.

The lower adsorption arm 10 may be moved to the upper side of the flexible stage 4 to move the curved glass G to the upper side of the wires 51, may be then lowered to seat the curved glass G on the wires 51, and may be lowered to be separated from the curved glass G after the curved glass G is seated on the wires 51. After being lowered between the curved glass G and the flexible stage 4, the lower adsorption arm 10 may escape from a space between the curved glass G and the flexible stage 4.

The lower adsorption arm 10 may be operated together with the upper adsorption arm 9. In other words, while the upper adsorption arm 9 transfers the display unit D to the lower side of the upper adsorption mechanism 3, the lower adsorption arm 10 may seat the curved glass G on the wire stage 5. Here, the present disclosure is not limited to the fact that the upper adsorption arm 9 and the lower adsorption arm 10 are simultaneously operated. Further, it is apparent that the upper adsorption arm 9 and the lower adsorption arm 10 may be moved within a time interval, and movement of either one of them may be completed before movement of the other is completed.

The lower adsorption arm 10 may withdraw the completely bonded curved display to the outside as well as lift the curved glass G up to the wire stage 5. In this case, the lower adsorption arm 10 may move the curved display to the outside of the lower chamber 1 and the upper chamber after lifting up the curved display after being moved to the lower side of the completely bonded curved display.

In this case, the number of components of the curved glass bonding apparatus may be minimized as compared with a case where a curved display adsorption arm is separately provided, which will be described below. On the other hand, the curved display bonding apparatus may include the curved display adsorption arm configured to withdraw the completely bonded curved display to the outside.

In this case, the lower adsorption arm 10 may seat the curved glass G on the wire stage 5, and the completely bonded curved display may be withdrawn to the outside by the curved display adsorption arm. In this case, the curved display adsorption arm may have the same structure as that of the lower adsorption arm, and only an operation time of the curved display adsorption arm may be different from that of the lower adsorption arm.

When the curved display bonding apparatus includes both the lower adsorption arm 10 and the curved display adsorption arm, the lower adsorption arm 10 may more rapidly seat the curved glass G on the wire stage 5. For example, while the curved display adsorption arm may withdraw the completely bonded curved display to the outside, and the lower adsorption arm 10 may seat the curved glass G on the wire stage 5 and may more rapidly bond a plurality of curved displays to each other.

Figure 4:
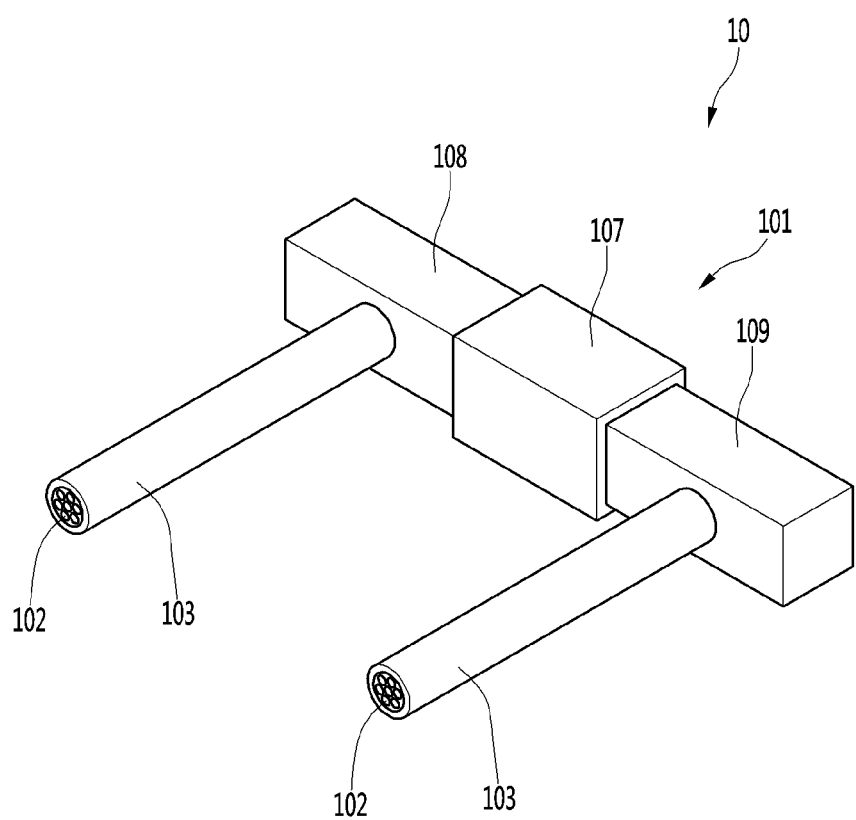
FIG. 4 is a perspective view illustrating a lower adsorption arm of FIG. 1.

As illustrated in FIG. 4, the lower adsorption arm 10 may include a lower frame 101, a pair of arms 102 provided in the lower frame 101, and adhesive coatings 103 arranged in the pair of arms 102 to be in line contact with or in point contact with the curved glass G. The length of the lower frame 101 may be varied or may not be varied.

When the length of the lower frame 101 is varied, the lower frame 101 may be configured by connecting a plurality of frames to each other. In this case, the lower frame may include one fixed frame 107, and at least one moving frame 108 and 109 arranged to move along the fixed frame 107.

For example, a first arm of the pair of arms 102 may be connected to the fixed frame 107, and a second arm of the pair of arms 102 may be connected to the moving frame. In this case, as the moving frame is moved, a separation distance between the pair of arms 102 may be adjusted.

As another example, the first arm of the pair of arms 102 may be connected to the first moving frame 108, and the second arm of the pair of arms 102 may be connected to the second moving frame 109. In this case, as the first moving frame 108 and the second moving frame 109 are moved, the separation distance between the pair of arms 102 may be adjusted.

An interval between the pair of arms 102 may be smaller than the transverse width of the curved glass G. An interval between the pair of arms 102 may be smaller than the interval between the plurality of wires 51. Each of the pair of arms 102 may be slidably connected to the lower frame 101. In this case, a guide rail configured to slidably guide the pair of arms 102 may be formed in the lower frame 101.

Each of the pair of arms 102 may have an overall rod shape. The pair of arms 102 may be spaced apart from each other in a transverse direction. The pair of arms 102 may be spaced apart from each other in a direction that is parallel to the lengthwise direction of the lower frame 101. Each of the pair of arms 102 may be connected to the lower frame 101 to be perpendicular to the lower frame 101.

Outer circumferential surfaces of the adhesive coatings 103 may include curved surfaces. The adhesive coatings 103 may be arranged on the outer circumferential surfaces of the pair of arms 102, respectively. The adhesive coatings 103 may have a hollow cylindrical shape, and may surround the outer circumferential surfaces of the arms 102.

The adhesive coatings 103 may be resin-based adhesive coating, and may minimize sliding of the curved glass G seated thereon. According to the above structure, in the lower adsorption arm 10, each of the pair of adhesive coatings 103 may be in contact with the curved surface C2 of the curved glass G.

Figure 5:
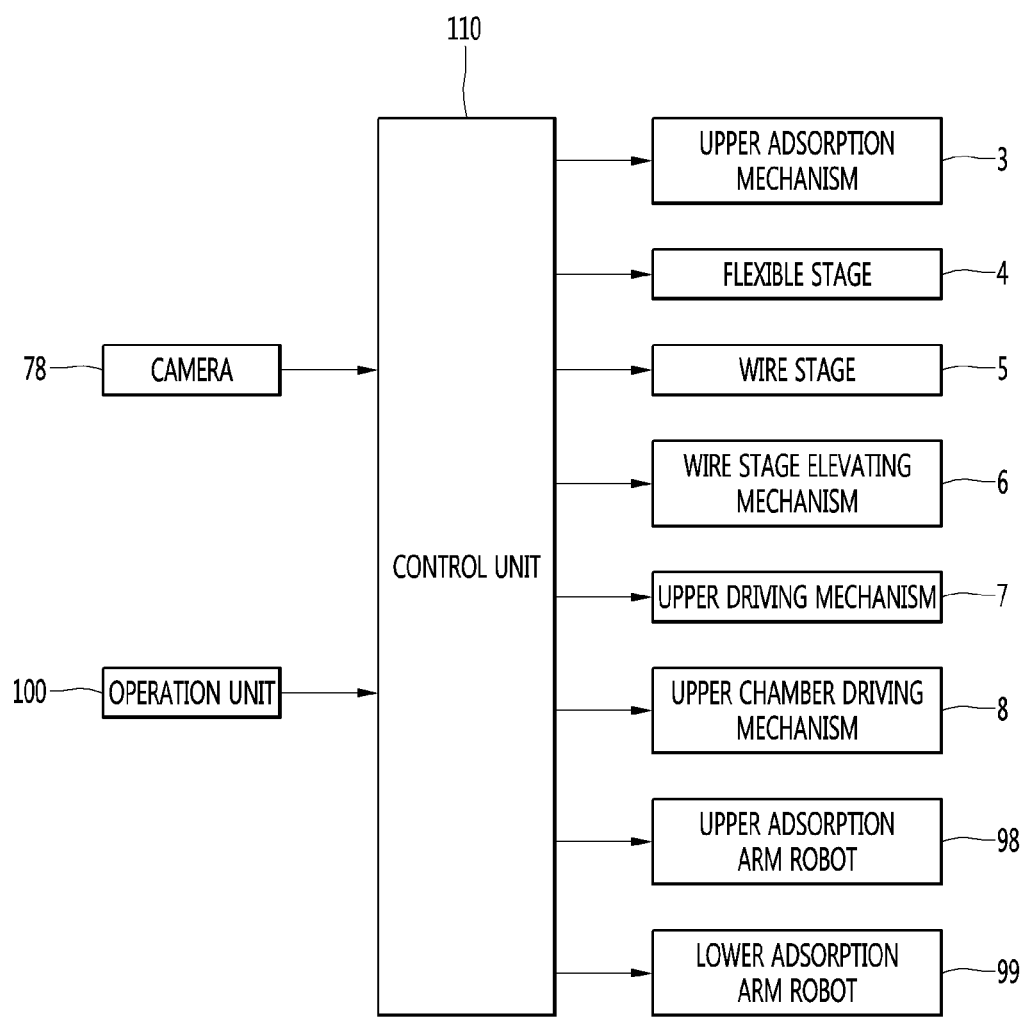
FIG. 5 is a control flow diagram illustrating the curved display bonding apparatus according to an embodiment of the present disclosure.

When the curved glass G is seated on the lower adsorption arm 10, the curved glass G may include a portion located between the pair of adhesive coatings 103, and a portion located on the pair of adhesive coatings 103, and the curved glass G may be stably supported on the lower adsorption arm 10 without sliding. As illustrated in FIG. 5, the curved display bonding apparatus may include an operation unit (or control input) 100 operated by an operator, and a control unit (or controller) 110 configured to operate the curved display bonding apparatus when an operation command is input by the operation unit 100.

The control unit 110 may control the upper adsorption mechanism 3. The control unit 110 may control the vacuum generator of the upper adsorption mechanism 3. The control unit 100 may control the flexible stage 4. The control unit 110 may control the fluid adjuster 41, and may control the fluid injector 44 and the fluid adjusting valve 46 in detail.

The control unit 110 may control the wire stage 5. The control unit 110 may control the tension adjuster 54, and may control the motor 56 of the tension adjuster 54 in detail. The control unit 110 may control the wire stage elevating mechanism 6, and may control the elevation motor of the wire stage elevating mechanism 6 in detail.

The control unit 110 may control the upper driving mechanism 7, and may control the upper adsorption chuck driving mechanism 71 and the upper adsorption pin driving mechanism 72 in detail. The control unit 110 may control the driving source of the upper adsorption chuck driving mechanism 71 and the driving source of the upper adsorption pin driving mechanism 72. The control unit 110 may control the adsorption chuck driving motors constituting the upper adsorption chuck driving mechanism 71, and may control the hydraulic cylinder or the linear motor constituting the upper adsorption pin driving mechanism 72.

The control unit 110 may control the upper chamber driving mechanism 8, and may control the hydraulic cylinder or the linear motor constituting the upper chamber driving mechanism 8. The control unit 110 may control the upper adsorption arm robot 98 to move the upper adsorption arm 9, and may control the lower adsorption arm robot 99 to move the lower adsorption arm 10.

Figure 6:
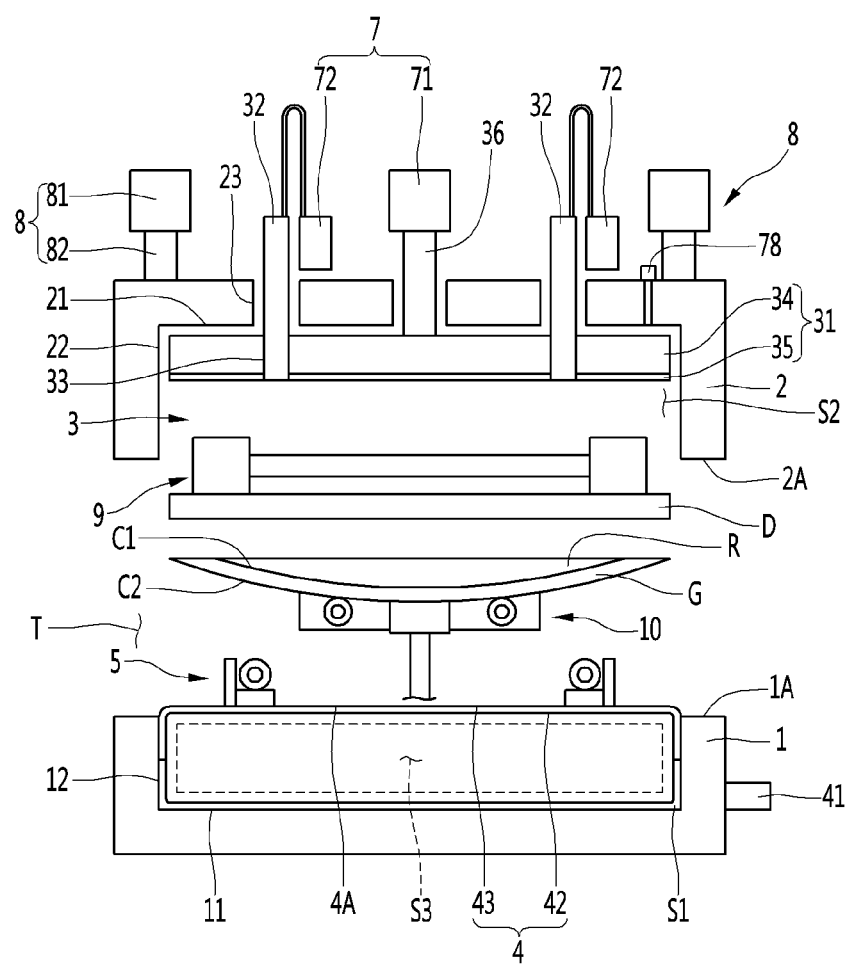
FIG. 6 is a sectional view when a curved glass and a display unit of FIG. 1 is moved between a lower chamber and an upper chamber.

Hereinafter, a bonding process of the above-configured curved display bonding apparatus will be described with reference to FIGS. 6 to 14. As illustrated in FIG. 6, the control unit 110 may control the upper adsorption arm robot 98 and the lower adsorption arm robot 99 to move the upper adsorption arm 9 and the lower adsorption arm 10 between the lower chamber 1 and the upper chamber 2.

The upper adsorption arm 9 and the lower adsorption arm 10 may be moved on a lateral side of the space between the lower chamber 1 and the upper chamber 2 in a transverse direction. Further, as illustrated in FIG. 6, the upper adsorption arm 9 may move the display unit D to the lower side of the upper adsorption mechanism 3, and the lower adsorption arm 10 may move the curved glass G to the upper side of the wire stage 5.

When the display unit D and the curved glass G are completely moved in the transverse direction, the display unit D and the curved glass G may be spaced apart from each other in a vertical direction, and may be spaced apart from the flexible stage 4 and the upper adsorption mechanism 3 between the flexible stage 4 and the upper adsorption mechanism 3 in a vertical direction, as illustrated in FIG. 6.

As illustrated in FIG. 7, when the display unit D and the curved glass G are completely moved between the flexible stage 4 and the upper adsorption mechanism 3, the control unit 110 may control the upper driving mechanism 7, particularly, the upper adsorption pin driving mechanism 72, to be lowered, and the upper adsorption pin 32 may be lowered to adsorb the display unit D.

Further, the control unit 100 may control the lower arm robot 99 to be lowered, or may control the wire stage elevating mechanism 6 to be raised. The control unit 100 may control the lower adsorption arm robot 99 such that the curved glass G is lowered to a height at which it is seated on the wires 51 of the wire stage 5. The control unit 100 may control the wire stage driving mechanism 6 such that the wires 51 of the wire stage 5 may be lifted up to a height at which they are in contact with the curved glass G.

The control unit 110 may control the upper adsorption arm robot 98 and the lower adsorption arm robot 99 such that the upper adsorption arm 9 and the lower adsorption arm 10 illustrated in FIG. 7 are withdrawn from the space between the lower chamber 1 and the upper chamber 2 to the outside, when the upper adsorption pin 32 is lowered to a height at which it adsorbs the display unit D and the curved glass G is seated on the wires 51 of the wire stage 5. When the upper adsorption arm 9 and the lower adsorption arm 10 are completely withdrawn from the space between the lower chamber 1 and the upper chamber 2 to the outside, the control unit 110 may control the upper adsorption pin driving mechanism 72 to be raised such that the upper adsorption pin 32 lifts the display unit D up to the upper adsorption chuck 31, as illustrated in FIG. 9.

Figure 10:
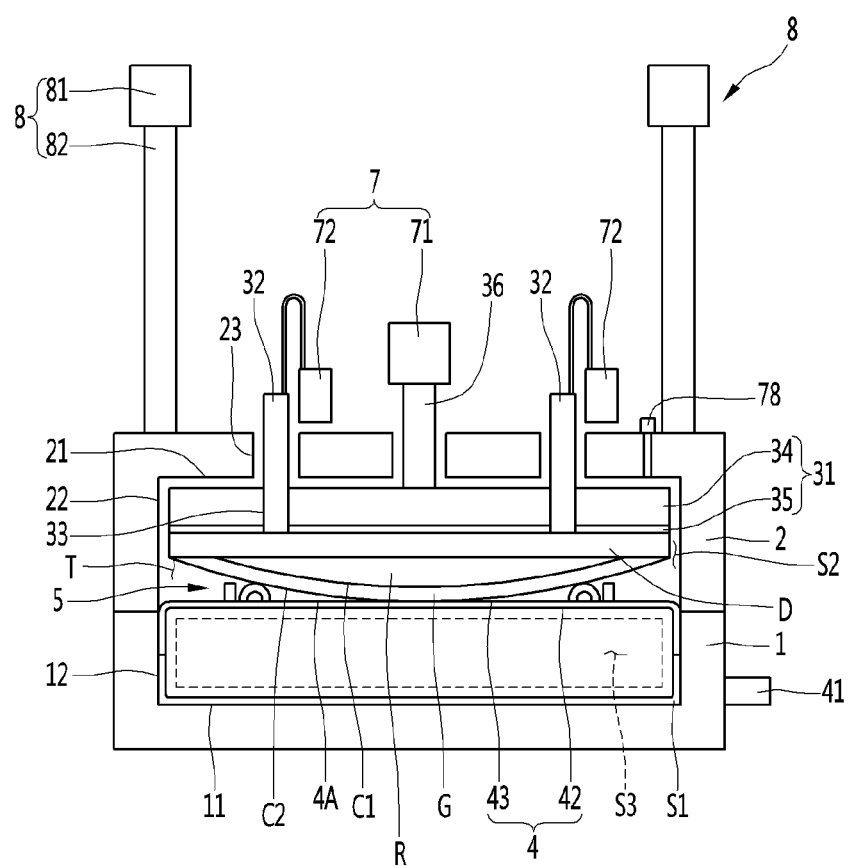
FIG. 10 is a sectional view of the display unit of FIG. 9 lowered to the curved glass and the upper chamber of FIG. 9 lowered to the lower chamber.

Further, as illustrated in FIG. 9, the control unit 110 may control the wire stage elevating mechanism to be lowered such that the curved glass G is lowered to a height at which it is seated on the flexible stage 4. When the display unit D is completely lifted up and the curved glass G is completely lowered, the control unit 110 may control the upper adsorption chuck driving mechanism 71 and the upper chamber driving mechanism 8 to be lowered such that the upper adsorption chuck 31 and the upper chamber are lowered, as illustrated in FIG. 10.

When the upper chamber 2 is lowered, the control unit 110 may control the upper chamber driving mechanism 8 such that the lower end 2A of the upper chamber 2 is moved to a height at which it comes into close contact with the upper end 1A of the lower chamber 1. When the upper adsorption chuck 31 is lowered, the control unit 110 may drive and rotate the upper adsorption chuck driving mechanism 71 in three axes, and may align the display unit D with the curved glass G.

Figure 11:
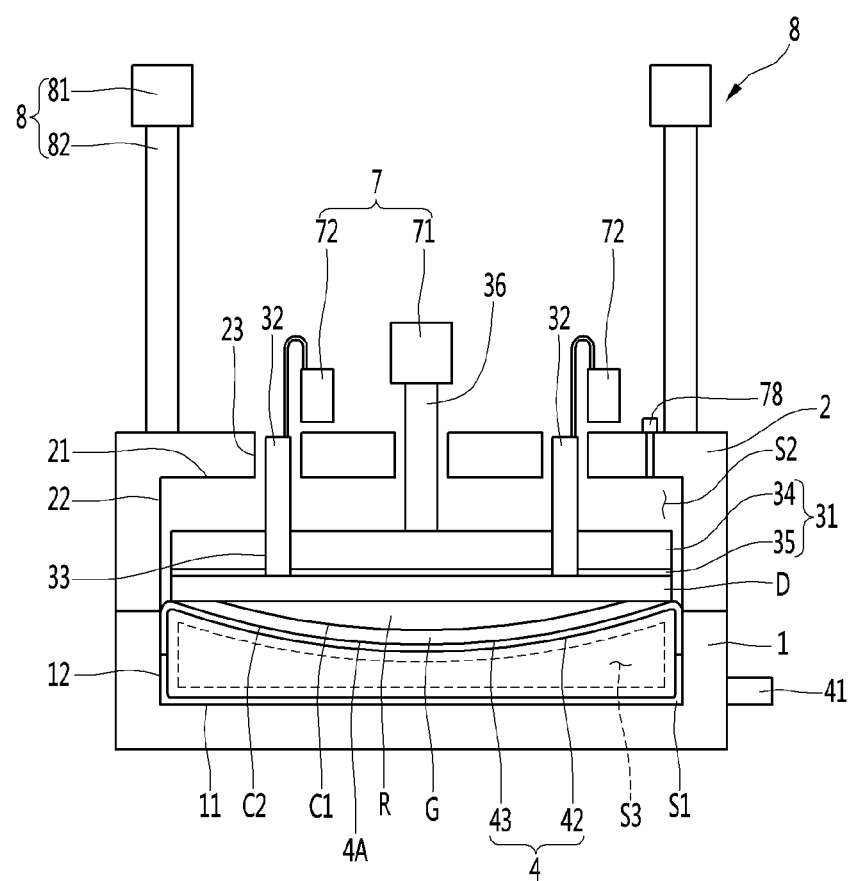
FIG. 11 is a sectional view of the display unit and the curved glass of FIG. 10 bonded to each other.

When the above-described lower chamber 2 is lowered, a sealed space between the lower chamber 1 and the upper chamber 2 may be formed by the lower chamber 1 and the upper chamber 2. As illustrated in FIG. 11, after the upper chamber 2 is completely lowered, the control unit 110 may control the upper adsorption chuck driving mechanism 71 such that the upper adsorption chuck 31 is additionally lowered. At this time, the control unit 110 may control the fluid adjuster 41.

The control unit 110 may control the fluid adjuster 41 of the flexible stage 4 such that the upper surface 4A of the flexible stage 4 surrounds the entire bottom surface of the curved glass G. The display unit D and the curved glass G may be bonded to each other while firmly contacting each other by a pressure applied downward from the upper adsorption chuck 31 and a pressure applied upward from the flexible stage 4, and the display unit D and the curved glass G, which may be bonded to each other, may constitute a curved display unit.

Figure 12:
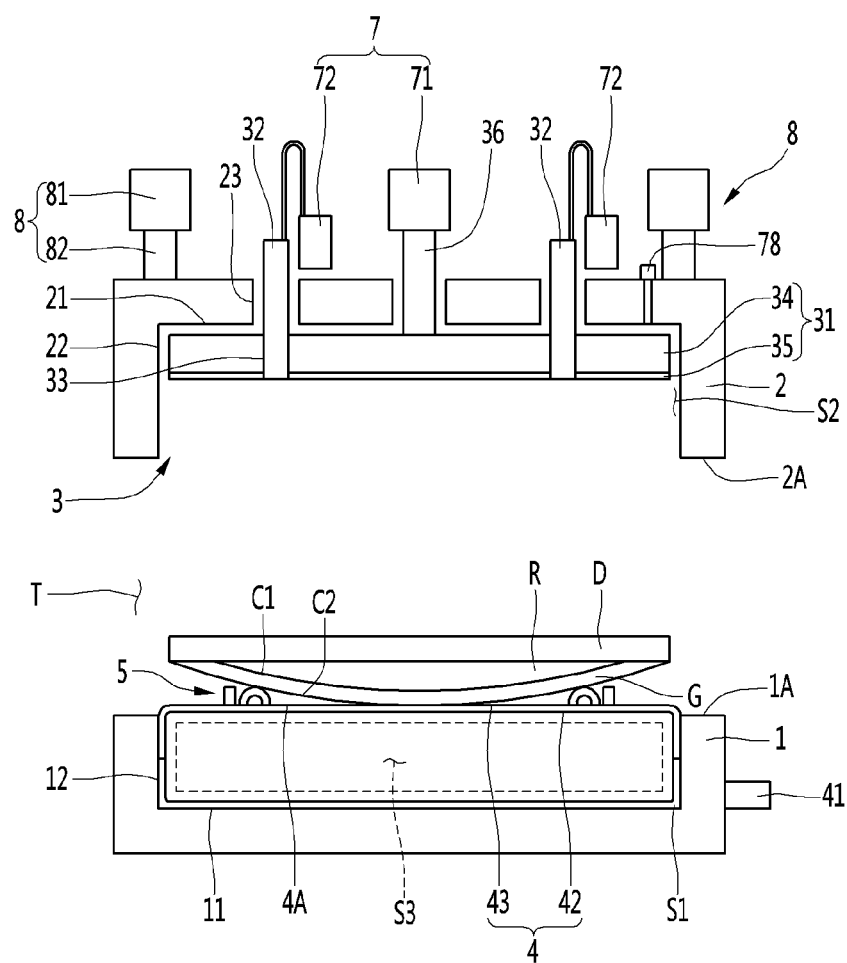
FIG. 12 is a sectional view of an upper adsorption mechanism of FIG. 11 separated from the display unit and the upper chamber.

When the display unit D and the curved glass G are bonded to each other, the control unit 110 may control the upper chamber driving mechanism 8 and the upper adsorption chuck driving mechanism 71 to be raised. Further, as illustrated in FIG. 12, the upper adsorption chuck 31 may be separated from the display unit D adsorbed to the curved glass G, and the upper adsorption chuck 31 may be lifted up together with the upper chamber 2.

Figure 13:
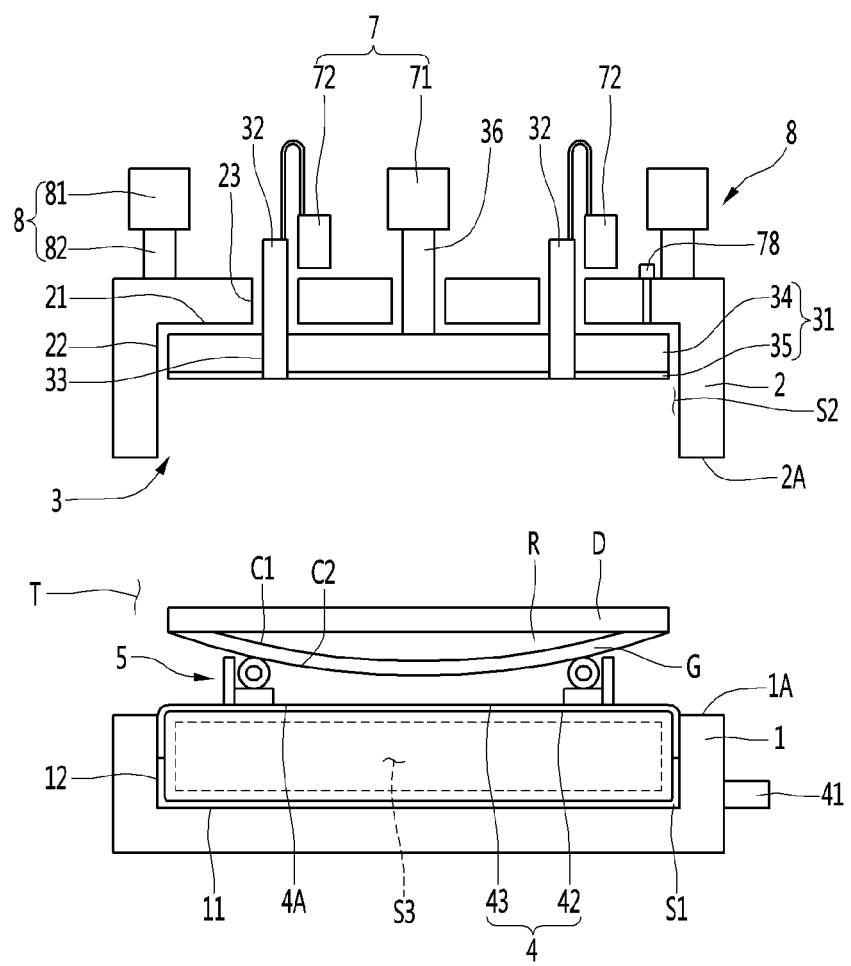
FIG. 13 is a sectional view of the wire stage of FIG. 12.

When the upper adsorption chuck 31 and the upper chamber 2 are completely lifted up, the control unit 110 may control the wire stage elevating mechanism 6 to be raised such that the curved glass G of the curved display is lifted up. As illustrated in FIG. 13, the wire stage 5 may lift up the curved display, and the curved glass G may be separated from the upper surface 4A of the flexible stage 4.

Figure 14:
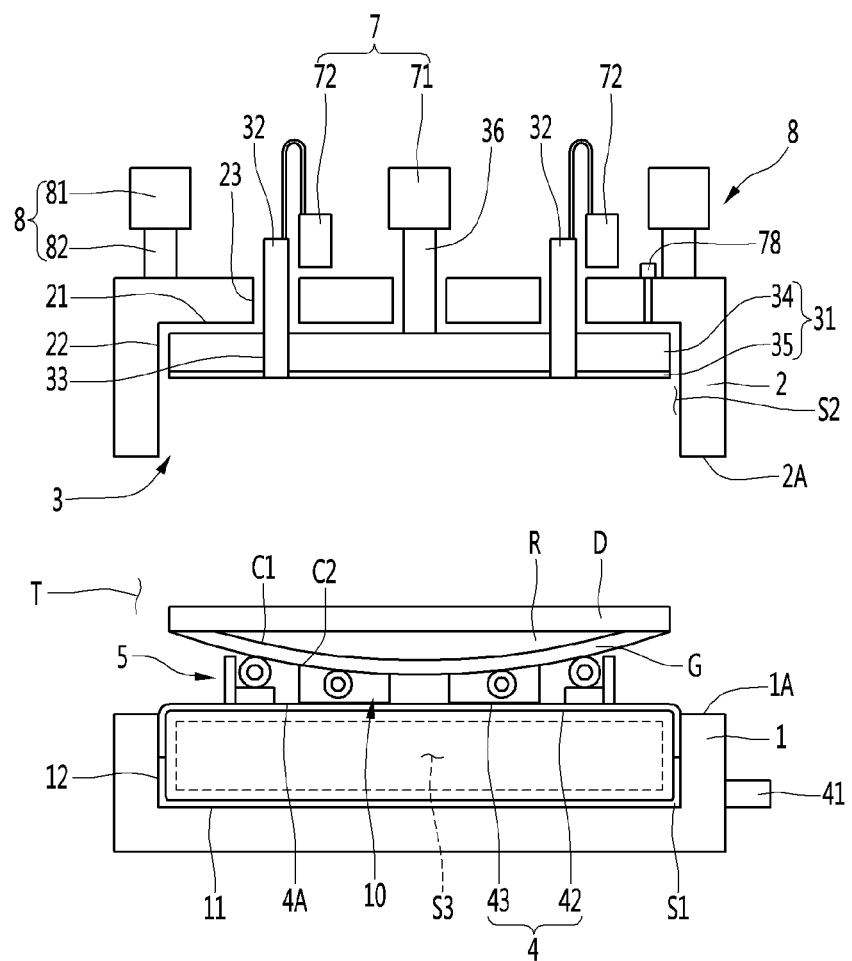
FIG. 14 is a sectional view of the lower adsorption arm according to the embodiment of the present disclosure moved to a lower side of the curved glass to transfer the curved display.
Figure 15:
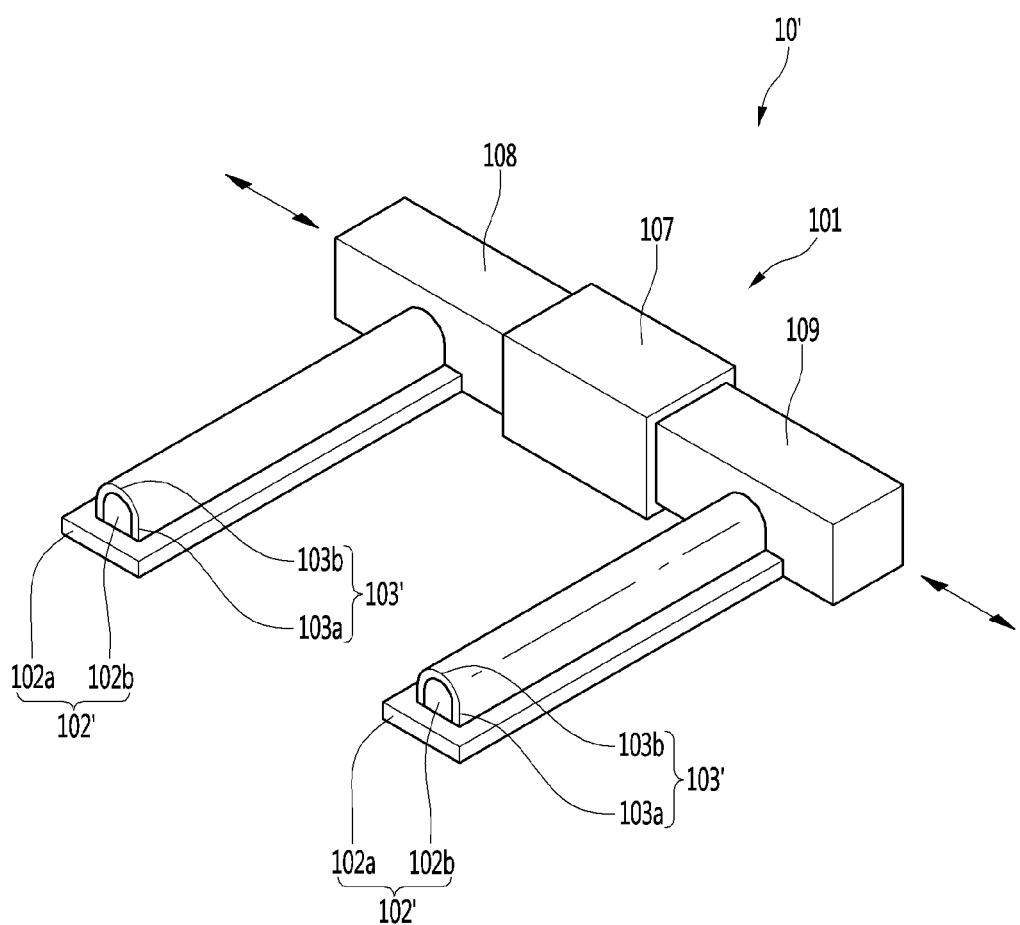
FIG. 15 is a perspective view illustrating a lower adsorption arm according to another embodiment of the present disclosure.
Figure 16:
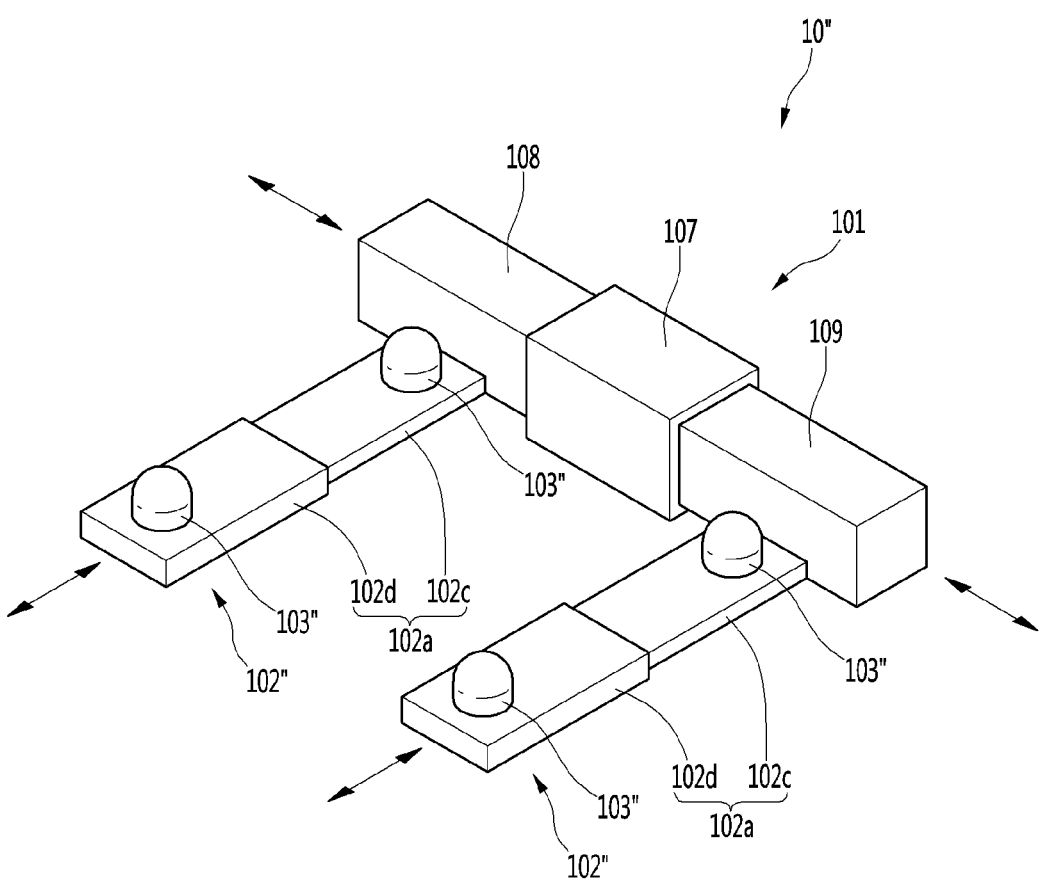
FIG. 16 is a perspective view illustrating a lower adsorption arm according to yet another embodiment of the present disclosure.

As illustrated in FIG. 14, when the curved display is completely lifted up by the wire stage 5, the control unit 110 may control the lower adsorption arm robot 99 such that the lower adsorption arm 10 comes into contact with the bottom surface of the curved glass G, and the control unit 110 may control the lower adsorption arm robot 99 such that the lower adsorption arm 10 withdraws the curved display from the space between the lower chamber 1 and the upper chamber 2 to the outside. While the above-described curved display G and the above-described display unit D are bonded to each other, the control unit 110 may control the tension adjuster 54 to adjust tension of the wires 51, and the wires 51 may help the curved glass G to be bonded while being stably supported.

A lower adsorption arm 10' according to another embodiment may include a lower frame 101, a pair of arms 102', and a pair of adhesive coatings 103', wherein the shapes of the pair of arms 102' and the pair of adhesive coatings 103' may be different from those according to the previous embodiment. The pair of arms 102' according to the present embodiment may have the same shape, and each of the arms 102' may include a rod-shaped arm base 102a and a protrusion 102b protruding from the upper surface of the arm base 102a.

The protrusion 102b may extend in the lengthwise direction of the arm base 102a. The protrusion 102b may include a pair of lateral surfaces and a semicircular upper surface connecting upper ends of the pair of lateral surfaces.

The pair of adhesive coatings 103' according to the present embodiment may have the same shape, and the adhesive coatings 103' may surround the protrusions 102b. The adhesive coatings 103' may surround outer surfaces of the protrusions 102b.

Each of the adhesive coatings 103' may include lower coatings 103a covering lateral surfaces of the protrusion 102b and an upper coating 103b formed at upper ends of the lower coatings to cover the upper surface of the protrusion 102b. The curved surface C2 (see FIG. 1) of the curved glass G may be in contact with the upper coatings 103b of the adhesive coatings 103'.

A lower adsorption arm 10" according to another embodiment may include a lower frame 101, a pair of arms 102", and a plurality of adhesive coatings 103", wherein the shapes of the pair of arms 102" and the plurality of adhesive coatings 103" may be different from those according to the previous embodiments. The pair of arms 102" may have the same shape, and each of the arms 102" may include a rod-shaped arm base 102a and a plurality of protrusions protruding from the upper surface of the arm base 102a.

The plurality of protrusions may be formed in the arm base 102a together, and the plurality of protrusions may be spaced apart from each other in the lengthwise direction of the arm base 102a. In the arms 102", the plurality of protrusions may be formed in one arm base 102a. Each of the plurality of protrusions may include a pair of lateral surfaces and a semicircular upper surface connecting upper ends of the pair of lateral surfaces, and the entire protrusion may have a curved surface, which may be like another embodiment.

The plurality of adhesive coatings 103" may have the same shape, and the adhesive coatings 103" may surround the protrusions. The adhesive coatings 103' may surround outer surfaces of the protrusions. The adhesive coatings 103' may have an open-bottomed semispherical shape.

The adhesive coatings 103' may surround the entire outer surfaces of the protrusions. For example, when the lateral surfaces and the curved upper surface are included, each of the adhesive coatings 103" may include lower coatings covering lateral surfaces of the protrusions, and an upper coating formed at upper ends of the lower coatings to cover the upper surfaces of the protrusions.

As another example, the adhesive coatings 103" may have a hollow semispherical shape, and the protrusions may have a semispherical shape. The curved surface C2 (see FIG. 1) of the curved glass G may be in contact with the adhesive coatings 103".

The lower adsorption arm 10" may include the plurality of adsorption arms 103" spaced apart from each other in the lengthwise direction of the arm base 102a and in a direction that is perpendicular to the lengthwise direction of the arm base 102a. In the present embodiment, when the arm base 102a is lengthened or shortened in the lengthwise direction thereof, a distance between the plurality of adhesive coatings 103" may be varied, and the curved display bonding apparatus may cope with curved glasses G having various sizes.

The arm base 102a may include a fixed lower base 102c fixed to the lower frame 101 and having at least one protrusion formed therein, and a moving lower base 102d arranged on the fixed lower base 102c to be linearly movable and having at least one protrusion formed therein. In this case, a distance between the adhesive coating 103" covering the protrusion of the fixed lower base 102c and the adhesive coating 103" covering the protrusion of the moving lower base 102d may be varied according to the entire length of the arm base 102a.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section could be termed a second element, component, region, layer or section without departing from the teachings of the present invention.

Spatially relative terms, such as "lower", "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "upper" relative the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the disclosure are described herein with reference to cross-section illustrations that are schematic illustrations of idealized embodiments (and intermediate structures) of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

An aspect of the present disclosure is to provide a curved display bonding apparatus which may bond a curved glass and a display unit to each other in a state in which the curved glass is supported with high stability. A curved display bonding apparatus for bonding a display unit to a curved glass according to an embodiment of the present disclosure may include a lower chamber in which a lower space is formed, an upper chamber which is arranged above the lower chamber and in which an upper space is formed, an upper adsorption mechanism accommodated in the upper space to be elevated and to which the display unit is adsorbed, a flexible stage accommodated in the lower space and having a deformable outer appearance, and a wire stage on which the curved glass is seated, wherein the wire stage comprises a plurality of wires, at least some of which is located above the flexible stage, such that the curved glass is seated on outer surfaces of the wires, at least a pair of the plurality of wires are spaced apart from each other, and the plurality of wires are seated on the flexible stage or are spaced apart from the flexible stage.

An inner space in which fluid is accommodated may be formed inside the flexible stage. Further, a fluid adjuster configured to adjust fluid of the inner space may be connected to the flexible stage. The curved display bonding apparatus may include an upper adsorption arm configured to transfer the display unit to a space between the lower space and the upper space.

The curved display bonding apparatus may further include an upper chamber driving mechanism configured to elevate the upper chamber. The flexible stage may include a flexible body having an inner space formed therein, and expanded or contracted by fluid in the inner space, and an adhesive part formed on an outer surface of the flexible body.

Each of the plurality of wires may include an inner metal wire, and an adhesive coating surrounding the inner metal wire. The wire stage may include a tension adjuster configured to adjust tension of the wires.

The tension adjuster may include a rotor to which the wires are connected, and a motor configured to rotate the rotor. The wire stage may include a tension adjuster frame supporting the tension adjuster, a connector which is spaced apart from the rotor and to which the wires are connected, and a connector frame supporting the connector.

The curved display bonding apparatus may further include a wire stage elevating mechanism configured to elevate the tension adjuster frame and the connector frame. Each of the tension adjuster frame and the connector frame may include an elevating body connected to the wire stage elevating mechanism and elevated, and a moving body arranged in the elevating body to be moved forward/rearward in a transverse direction.

The curved display bonding apparatus may further include a lower adsorption arm configured to seat the curved glass on the plurality of wires. Resin may be formed on any one curved surface of the curved glass. The lower adsorption arm may seat, on the wires, a curved surface that is opposite to the curved surface on which the resin is formed among opposite surfaces of the curved glass.

The lower adsorption arm may include a lower frame, a pair of arms provided in the lower frame, and adhesive coatings arranged in the pair of arms to be in line contact with or in point contact with the curved glass. An interval between the pair of arms may be smaller than an interval between the plurality of wires.

Each of the pair of arms may be slidably connected to the lower frame. The lower frame may include a main frame, and at least one moving frame arranged to be linearly moved along the main frame. Each of the pair of arms may include an arm base connected to the lower frame, and protrusions protruding from an upper surface of the arm base, wherein the adhesive coatings surround outer surfaces of the protrusions.

The plurality of protrusions may be formed in the arm base, and the plurality of protrusions may be spaced apart from each other in a lengthwise direction of the arm base. The arm base may include a fixed lower base connected to the lower frame, and having at least one protrusion formed therein, and a moving lower base arranged in the fixed lower base to be linearly movable, and having at least one protrusion formed therein. The upper adsorption mechanism may include an upper adsorption chuck arranged in the upper space to be elevated, and an upper adsorption pin to which an upper surface of the display unit is adsorbed, and which transfers the display unit to the upper adsorption chuck.

According to the embodiment of the present disclosure, when the curved glass is seated on the plurality of wires, the curved glass may be seated on the flexible stage together with the plurality of wires, and when the plurality of wires and the flexible stage support the curved glass with high stability, the curved glass and the display unit may be bonded to each other at high reliability. Further, the present disclose has advantages in that the curved display bonding apparatus may cope with a change in the size of the curved glass, and one curved display bonding apparatus may be used to bond various kinds of curved displays, so that manufacturing costs may be reduced.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A curved display bonding apparatus to bond a display to a curved glass, the curved display bonding apparatus comprising:
    a lower chamber including a lower space;
    an upper chamber arranged above the lower chamber and including an upper space;
    an upper adsorption mechanism accommodated in the upper space and configured to be elevated, and to which the display is adsorbed;
    a flexible stage accommodated in the lower space and having a deformable outer surface; and
    a wire hangar on which the curved glass is seated, wherein the wire hangar includes a plurality of wires, at least some of which are located above the flexible stage, such that the curved glass is seated on outer surfaces of the wires, wherein at least a pair of the plurality of wires are spaced apart from each other, and wherein the plurality of wires are seated on the flexible stage or are spaced apart from the flexible stage.

2. The curved display bonding apparatus of claim 1, wherein an inner space in which fluid is accommodated is formed inside the flexible stage, and
wherein a fluid adjuster configured to adjust an amount of the fluid inside the inner space is connected to the flexible stage.

3. The curved display bonding apparatus of claim 1, further including:
an upper adsorption arm configured to transfer the display to a space between the lower space and the upper space.

4. The curved display bonding apparatus of claim 1, further including:
an upper chamber driving mechanism configured to elevate the upper chamber.

5. The curved display bonding apparatus of claim 1, wherein the flexible stage includes,
a flexible body having an inner space formed therein and configured to be expanded or contracted by fluid in the inner space, and
an adhesive layer formed on an outer surface of the flexible body.

6. The curved display bonding apparatus of claim 1, wherein each of the plurality of wires includes,
an inner metal wire, and
an adhesive coating surrounding the inner metal wire.

7. The curved display bonding apparatus of claim 1, wherein the wire hangar includes a tension adjuster configured to adjust a tension of the plurality of wires.

8. The curved display bonding apparatus of claim 7, wherein the tension adjuster includes:
a rotor to which the wires are connected; and
a motor configured to rotate the rotor.

9. The curved display bonding apparatus of claim 7, wherein the wire hangar includes:
a tension adjuster frame supporting the tension adjuster;
a connector spaced apart from the rotor and to which the plurality of wires are connected; and
a connector frame supporting the connector.

10. The curved display bonding apparatus of claim 9, further including:
a wire hangar elevating mechanism configured to elevate the tension adjuster frame and the connector frame.

11. The curved display bonding apparatus of claim 10, wherein each of the tension adjuster frame and the connector frame includes:
an elevating body connected to the wire hangar elevating mechanism and configured to be elevated, and
a moving body arranged in the elevating body to be moved forward and rearward in a transverse direction.

12. The curved display bonding apparatus of claim 1, further including:
a lower adsorption arm configured to seat the curved glass on the plurality of wires.

13. The curved display bonding apparatus of claim 12, wherein the curved glass includes a first curved surface and a second curved surface, and wherein the lower adsorption arm seats, on the wires, the first curved surface that is opposite to the second curved surface on which resin is formed.

14. The curved display bonding apparatus of claim 12, wherein the lower adsorption arm includes:
a lower frame;
a pair of arms provided on the lower frame; and
adhesive coatings arranged on the pair of arms to be in line contact with or in point contact with the curved glass, wherein a distance between the pair of arms in a first direction is smaller than a distance between the plurality of wires in the first direction.

15. The curved display bonding apparatus of claim 14, wherein each of the pair of arms is slidably connected to the lower frame.

16. The curved display bonding apparatus of claim 14, wherein the lower frame includes:
a main frame, and
at least one moving frame arranged to be linearly moved along the main frame.

17. The curved display bonding apparatus of claim 14, wherein each of the pair of arms includes:
an arm base connected to the lower frame, and
protrusions protruding from an upper surface of the arm base, wherein the adhesive coatings surround outer surfaces of the protrusions.

18. The curved display bonding apparatus of claim 1, wherein the upper adsorption mechanism includes:
an upper adsorption chuck arranged in the upper space and configured to be elevated; and
an upper adsorption pin to which an upper surface of the display is adsorbed, and which transfers the display to the upper adsorption chuck.

19. A curved display bonding apparatus configured to bond a display to a curved glass and comprising:
a lower chamber that forms a lower space;
an upper chamber that forms an upper space corresponding to the lower space;
an upper adsorption chuck including an upper adsorption body having first and second surfaces and a first adhesive layer on one of the first and second surfaces, the upper absorption chuck being accommodated within the upper space;
a flexible body including a second adhesive layer on an upper surface of the flexible body, the flexible body being accommodated within the lower space;
a wire hangar including a plurality of wires upon which the curved glass is seated;
an upper adsorption arm configured to locate the display between the upper chamber and the lower chamber; and
a lower adsorption arm configured to locate the curved glass between the upper chamber and the lower chamber.

20. The curved display bonding apparatus of claim 19, further including:
a controller that controls movement of the upper adsorption chuck, the flexible body, the wire hangar, the upper adsorption arm, and the lower adsorption arm; and
a camera located in the upper chamber and configured to position the display and the curved glass between the upper chamber and the lower chamber.

* * * * *